(12) United States Patent
Chidambaram et al.

(10) Patent No.: US 7,129,127 B2
(45) Date of Patent: Oct. 31, 2006

(54) INTEGRATION SCHEME TO IMPROVE NMOS WITH POLY CAP WHILE MITIGATING PMOS DEGRADATION

(75) Inventors: Periannan Chidambaram, Richardson, TX (US); Srinivasan Chakravarthi, Richardson, TX (US); Haowen Bu, Plano, TX (US); Rajesh Khamankar, Coppell, TX (US)

(73) Assignee: Texas Instruments Incorporated, Dallas, TX (US)

( * ) Notice: Subject to any disclaimer, the term of this patent is extended or adjusted under 35 U.S.C. 154(b) by 202 days.

(21) Appl. No.: 10/950,138

(22) Filed: Sep. 24, 2004

(65) Prior Publication Data

US 2006/0068541 A1    Mar. 30, 2006

(51) Int. Cl.
*H01L 21/8238* (2006.01)
(52) U.S. Cl. ............... 438/231; 438/595; 257/E21.64
(58) Field of Classification Search ............... 438/231; 257/E21.64
See application file for complete search history.

(56) References Cited

U.S. PATENT DOCUMENTS

| | | | |
|---|---|---|---|
| 5,019,882 A | 5/1991 | Solomon et al. | |
| 5,241,197 A | 8/1993 | Murakami et al. | |
| 5,683,934 A | 11/1997 | Candelaria | |
| 5,849,615 A * | 12/1998 | Ahmad et al. | 438/231 |
| 5,863,827 A | 1/1999 | Joyner | |
| 5,882,981 A | 3/1999 | Rajgopal et al. | |
| 6,004,871 A | 12/1999 | Kittl et al. | |
| 6,087,241 A | 7/2000 | St. Amand et al. | |
| 6,180,454 B1 | 1/2001 | Chang et al. | |
| 6,211,064 B1 | 4/2001 | Lee | |
| 6,214,699 B1 | 4/2001 | Joyner | |
| 6,261,964 B1 | 7/2001 | Wu et al. | |
| 6,284,233 B1 | 9/2001 | Simon et al. | |
| 6,284,626 B1 | 9/2001 | Kim | |
| 6,284,633 B1 | 9/2001 | Nagabushnam et al. | |
| 6,303,486 B1 | 10/2001 | Park | |
| 6,368,967 B1 | 4/2002 | Besser | |
| 6,380,029 B1 | 4/2002 | Chang et al. | |
| 6,406,973 B1 | 6/2002 | Lee | |
| 6,495,853 B1 | 12/2002 | Holbrook et al. | |

(Continued)

OTHER PUBLICATIONS

U.S. Appl. No. 10/877,154, filed Jun. 25, 2004, Chidambaram.

(Continued)

*Primary Examiner*—Chandra Chaudhari
(74) *Attorney, Agent, or Firm*—Rose Alyssa Keagy; W. James Brady, III; Frederick J. Telecky, Jr.

(57) ABSTRACT

A method (200) fabricating a semiconductor device is disclosed. A poly oxide layer is formed over gate electrodes (210) on a semiconductor body and active regions defined within the semiconductor body in PMOS and NMOS regions. A nitride containing cap oxide layer is formed over the grown poly oxide layer (212). Offset spacers are formed adjacent to sidewalls of the gate electrodes (216). Extension regions are then formed (214) within the PMOS region and the NMOS region. Sidewall spacers are formed (218) adjacent to the sidewalls of the gate. electrodes. An n-type dopant is implanted into the NMOS region to form source/drain regions and a p-type dopant is implanted with an overdose amount into the PMOS region to form the source/drain regions within the PMOS region (220). A poly cap layer is formed over the device (222) and an anneal or other thermal process is performed (224) that causes the p-type dopant to diffuse into the nitride containing cap oxide layer and obtain a selected dopant profile having sufficient lateral abruptness.

21 Claims, 8 Drawing Sheets

U.S. PATENT DOCUMENTS 6,573,172 B1 6/2003 En et al.
6,767,778 B1 7/2004 Wang et al.
2003/0111699 A1 6/2003 Wasshuber et al.

OTHER PUBLICATIONS

U.S. Appl. No. 10/901,568, filed Jul. 29, 2004, Chidambaram et al.

* cited by examiner

US 7,129,127 B2

INTEGRATION SCHEME TO IMPROVE NMOS WITH POLY CAP WHILE MITIGATING PMOS DEGRADATION

FIELD OF INVENTION

The present invention relates generally to semiconductor devices and, more particularly, to an integration scheme that improves performance of NMOS devices with a poly cap layer while mitigating performance degradation of PMOS devices.

BACKGROUND OF THE INVENTION

A conventional MOS transistor generally includes a semiconductor substrate, such as silicon, having a source, a drain, and a channel positioned between the source and drain. A gate stack composed of a conductive material (a gate conductor), an oxide layer (a gate oxide), and sidewall spacers, is typically located above the channel. The gate oxide is typically located directly above the channel, while the gate conductor, generally comprised of polycrystalline silicon (polysilicon) material, is located above the gate oxide. The sidewall spacers protect the sidewalls of the gate conductor.

Generally, for a given electric field across the channel of a MOS transistor, the amount of current that flows through the channel is directly proportional to a mobility of carriers in the channel. Thus the higher the mobility of the carriers in the channel, the more current can flow and the faster a circuit can perform when using high mobility MOS transistors. One mechanism to increase the mobility of the carriers in the channel of an MOS transistor is to produce a mechanical stress or strain in the channel.

A compressive strained channel typically provides hole mobility enhancement, which is particularly beneficial for PMOS devices, whereas a tensile strained channel typically provides electron mobility enhancement, which is particularly beneficial for NMOS devices. An exemplary method of introducing tensile strain in a channel region is to cover transistor devices with a capped poly layer comprised of a selected material that, when annealed, generates the tensile strain in the channel regions of NMOS devices. However, the capped poly layer can degrade hole mobility in channel regions of PMOS devices and cause performance of PMOS transistor devices to degrade.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention facilitates semiconductor device fabrication by utilizing a nitride containing cap oxide layer to mitigate degradation of PMOS transistor device performance while permitting improvement of NMOS transistor device performance. The presence of the nitride containing cap oxide layer enhances diffusion of p-type dopants implanted in PMOS transistor devices, which allows a more desirable p-type dopant profile within source/drain regions of the PMOS transistor devices. As a result of the dopant profile, degradation of PMOS device performance is mitigated while allowing improvement of NMOS device performance via application of tensile stress.

A method of fabricating a semiconductor device is disclosed. A poly oxide layer is formed over gate electrodes on a semiconductor body and active regions defined within the semiconductor body in PMOS and NMOS regions. A nitride containing cap oxide layer is formed over the grown poly oxide layer. Offset spacers are formed adjacent to sidewalls of the gate electrodes. Extension regions are then formed within the PMOS region and the NMOS region. Sidewall spacers are formed adjacent to the sidewalls of the gate electrodes. An n-type dopant is implanted into the NMOS region to form source/drain regions and a p-type dopant is implanted with an overdose amount into the PMOS region to form the source/drain regions within the PMOS region. A poly cap layer is formed over the device and an anneal or other thermal process is performed that causes the p-type dopant to diffuse into the nitride containing cap oxide layer and obtain a selected dopant profile having sufficient lateral abruptness.

The following description and annexed drawings set forth in detail certain illustrative aspects and implementations of the invention. These are indicative of but a few of the various ways in which the principles of the invention may be employed.

DETAILED DESCRIPTION OF THE INVENTION

Figure 1A:
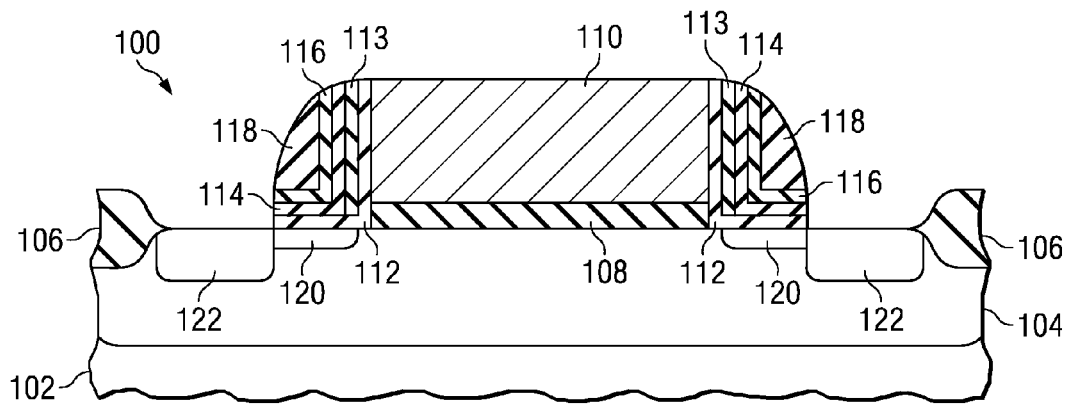
FIGS. 1A and 1B illustrate a conventional PMOS semiconductor device formed with a conventional cap oxide layer.

One or more implementations of the present invention will now be described with reference to the attached drawings, wherein like reference numerals are used to refer to like elements throughout, and wherein the illustrated structures are not necessarily drawn to scale. The invention provides transistor structures and methods in which transistor mobility is improved while reducing masks employed in fabrication thereof.

Figure 1B:
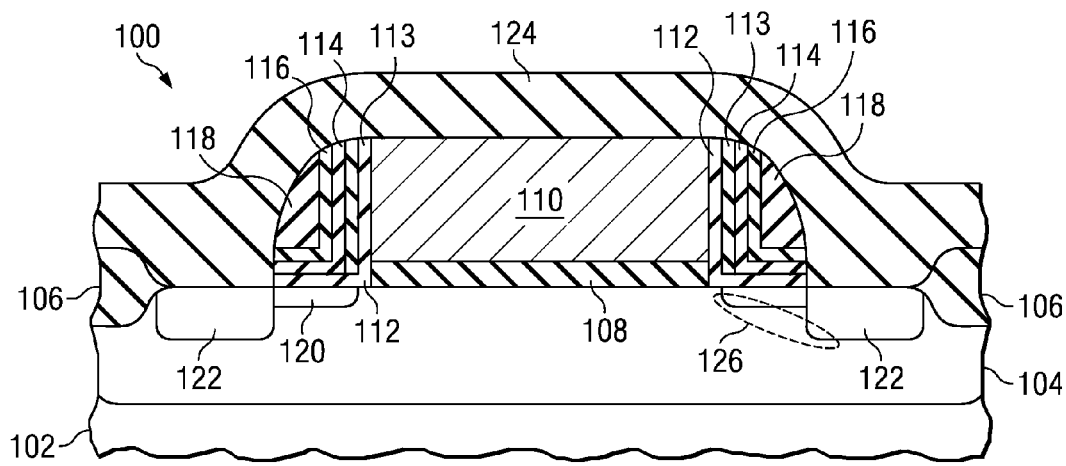

FIGS. 1A and 1B illustrate a conventional PMOS semiconductor device formed with a conventional cap oxide layer. FIG. 1A depicts the conventional semiconductor device subsequent to sidewall formation and FIG. 1B depicts the conventional semiconductor device after formation of a capped poly layer and performance of an anneal. The inventors of the present invention appreciate that the presence of the caped poly layer causes hydrogen diffusion during the anneal resulting in an undesirable dopant profile, particularly laterally.

As stated above, FIG. 1A illustrates the conventional semiconductor device after formation of sidewall structures. An n-type well region 104 is formed in a semiconductor substrate or body 102. Isolation regions 106 are formed to isolate adjacent transistor devices from each other. A gate oxide layer 108 is formed on a surface of the substrate 102 as shown in FIG. 1A and a gate electrode 110, typically comprised of polysilicon, is formed on the gate oxide layer 108. Subsequently, the gate electrode 110 and the gate oxide layer 108 are patterned to form the gate electrode 110 and the gate oxide 108 as shown in FIG. 1A. A relatively thin poly oxide layer or film 112 is grown over the device. Then, depositing and patterning a selected material, such as nitride, form offset spacers 113. An extension region implant is performed to form extension regions 120 by implanting a p-type dopant with relatively low energy.

A cap oxide layer 114 comprised of oxide is formed over the device and a nitride spacer layer 116 is formed on the cap oxide layer 114. Depositing the oxide material forms the cap oxide layer 114. Subsequently, a spacer oxide 118 is formed on the nitride spacer layer 116. A spacer etch is then performed to remove portions of the spacer oxide 118, the nitride spacer layer 116, the cap oxide layer 114, and the thin poly oxide layer 112 leaving sidewall structures as shown in FIG. 1A. Finally, source/drain regions 122 are formed by implanting a p-type dopant, such as boron.

FIG. 1B illustrates the conventional semiconductor device 100 after forming a capped poly layer 124 and performing an anneal. The capped poly layer 124 is formed and the anneal performed in order to improve channel mobility (electron mobility) in PMOS devices. However, the capped poly layer 124 includes a significant amount of Hydrogen that impacts the diffusability of p-type dopants, particularly boron, during the anneal. As a result, a large amount of implanted dopants diffuse out of the source/drain regions and tend to create a more gradual dopant profile, in terms of change in dopant concentration, laterally across the source/drain regions 122. The amount/concentration of implantation can be increased for the source/drain implants to counter the loss/migration of the p-type dopants out of the source/drain regions. However, the gradual dopant profile still remains and performance of the PMOS devices remains degraded.

Figure 2:
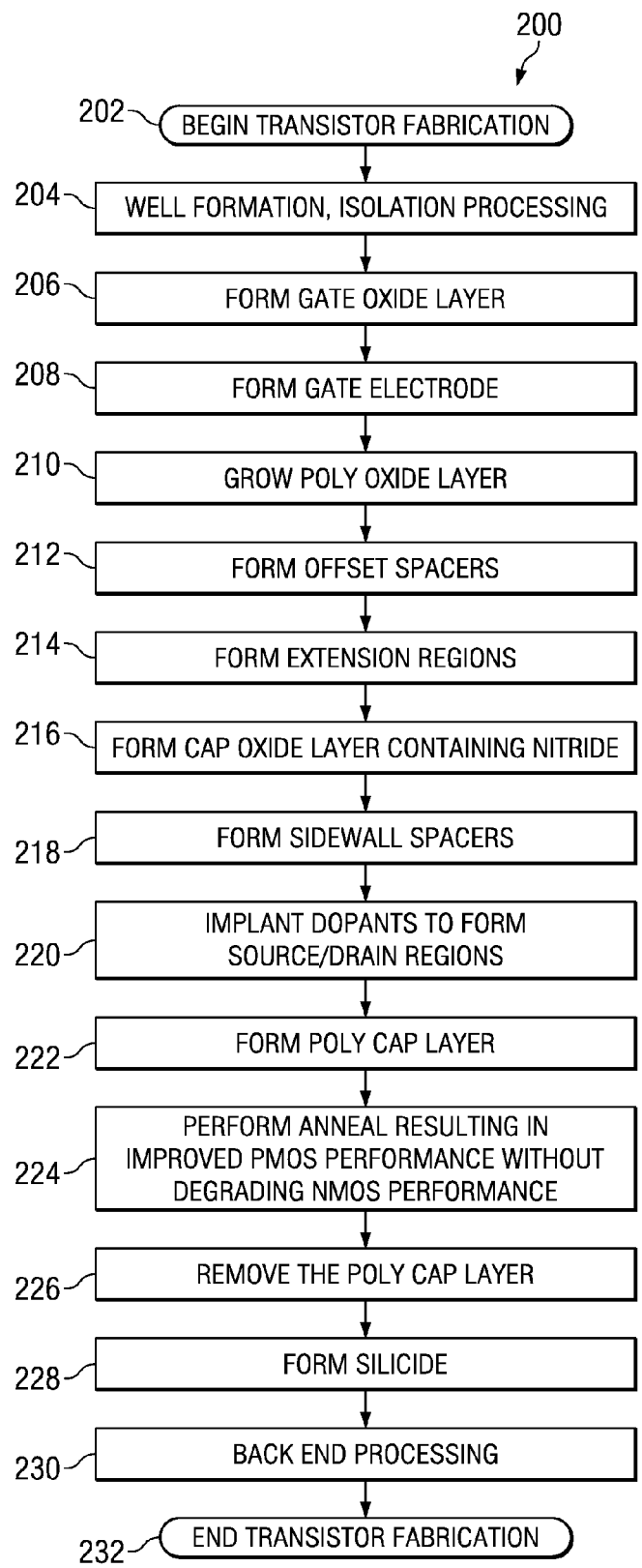
FIG. 2 is a flow diagram illustrating a method of fabricating a semiconductor device without substantially degrading PMOS performance in accordance with an aspect of the present invention.

FIG. 2 is a flow diagram illustrating a method 200 of fabricating a semiconductor device in accordance with an aspect of the present invention. The method fabricates the device with a nitride containing cap oxide layer and a strain inducing poly cap layer. Subsequent to forming the poly cap layer, the method 200 performs a thermal process that induces strain in channel regions thereby improving NMOS performance. Degradation of PMOS performance is mitigated because of the presence of the nitride containing cap oxide layer.

While the exemplary method 200 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the fabrication of ICs and composite transistors illustrated and described herein, as well as in association with other transistors and structures not illustrated, including but not limited to NMOS and/or PMOS composite transistors.

The method 200 begins at 202, wherein transistor fabrication is initiated, and transistor well formation and isolation processing is performed at 204 thereby defining NMOS and PMOS regions, wherein NMOS regions comprise a p-well in which n-type source/drain regions will later be formed, and PMOS regions comprise an N-well in which p-type source/drain regions will later be formed, respectively. In addition, isolation regions may comprise shallow trench isolation (STI) or field oxide regions (LOCOS) that serve to define various active areas and electrically isolate various active areas laterally from one another.

The method 200 continues at 206, wherein a gate oxide layer is formed in active areas defined by the various formed isolation regions. In one example, the gate oxide comprises a thin, thermally grown silicon dioxide layer, however, other type gate dielectrics (such as high-k dielectrics) may be formed and are contemplated by the present invention. A conductive gate layer is then deposited over the gate oxide at 208 and patterned to form a conductive gate electrode. For example, a polysilicon layer may be deposited via chemical vapor deposition (CVD) and patterned via etching to form gate electrodes in both NMOS and PMOS regions, respectively.

A poly oxide layer is formed by performing a thermal oxide growth process at 210. The poly oxide layer is formed so as to be relatively thin (e.g., 8 Angstroms). Subsequently, an offset spacer is then formed on lateral edges of the conductive gate electrodes at 212. For example, a thin offset layer (e.g., an oxide or nitride layer) is formed, generally conformably, over the patterned gate and then etched using a generally anisotropic dry etch to remove offset layer material on top of the gate and in the source/drain regions, leaving a thin offset spacer material on lateral edges of the gate.

An extension region implant is then performed at 214 to form extension regions, wherein dopants are introduced in active regions of the device. For example, lightly doped, medium doped or heavily doped extension region implants are performed in the NMOS and PMOS regions, respectively, wherein the gate structure serves to self-align the extension regions. A thermal process such as a rapid thermal anneal can then be employed to activate the extension region dopants, which causes the extension regions to diffuse laterally slightly underneath the offset spacer toward the channels.

A cap oxide layer containing nitride is formed over the device at 216. The cap oxide layer is deposited via a suitable deposition process such as chemical vapor deposition (CVD) with a silicon source, such as silane ($SiH_4$), in the presence of a nitrogen containing gas, such as ammonia ($NH_4$). The formed cap oxide layer is typically comprised of about 1 percent to 5 percent atoms of nitride. Other techniques of introducing nitride into the cap oxide layer are contemplated in accordance with the present invention, including nitriding the cap oxide layer after it is deposited. Generally, a greater percentage of nitride results in greater diffusion of boron during a subsequent poly cap anneal. Thus, the percentage of nitride in the cap oxide layer is selectable to attain a desired enhancement of boron diffusion, which in turn controls/alters a profile of source/drain regions formed within a PMOS region. As a result, the profile of the source/drain regions can be adjusted to have a greater lateral abruptness, when formed, thereby mitigating degradation in performance of formed devices within the PMOS region by adjusting/selecting the percentage of nitride in the cap oxide layer.

Still referring to FIG. 2, sidewall spacers are then formed on the gate structures at 218. The poly oxide layer and the cap oxide layer can be employed as etch stop layers in formation of the sidewall spacers. The composition of the sidewall spacers comprises insulating materials, such as oxide, nitride, or a combination of one or more such layers. The sidewall spacers are formed by depositing a layer of such spacer material(s) over the device in a generally conformal manner, followed by an anisotropic etch thereof, thereby removing such spacer material from the top of the gate structure and from the moat or source/drain area and leaving a region on the lateral edges of the gate structure, overlying the offset spacers. The sidewall spacers are substantially thicker than the offset spacers, thereby facilitating subsequent formation of the source/drain regions and causing them to be offset from lateral edges of the gate.

An exemplary sidewall spacer can be formed by depositing a layer of nitride followed by depositing a layer of oxide on the nitride layer. Subsequently, the nitride layer and the layer of oxide are etched anisotropically to form the sidewall spacers. The cap oxide layer can be employed as an etch stop layer for etching of the nitride layer and facilitate forming L shaped nitride spacers within the sidewall spacers.

Source/drain regions are then formed in the NMOS and PMOS regions at 220 by implanting selected dopants within the NMOS and PMOS regions. The source/drain regions within the NMOS region are formed using an NSD mask to implant an n-type dopant (e.g., phosphorous) into the NMOS region and the source/drain regions within the PMOS region are formed using a PSD mask to implant a p-type dopant (e.g., boron) into the PMOS region. The source/drain dopant is introduced into the exposed areas (top of gate electrode and active areas not covered by the sidewall spacers). The p-type dopant is implanted with a higher amount/concentration in order to compensate for loss due to diffusion resulting from the cap oxide layer and the not yet formed poly cap layer. The formed source/drain regions are self-aligned with respect to the sidewall spacers, and thus are laterally spaced from the extension regions.

A poly cap layer is formed over the device at 222 by, for example, depositing a lower oxide layer, a nitride layer, and a top oxide layer. The lower oxide layer has a suitable thickness such as, for example, about 20 to 200 Angstroms, which serves as an etch stop layer and protects underlying portions of the semiconductor device. The nitride layer is formed on the lower oxide layer and has a suitable thickness such as, for example, about 200 to about 800 Angstroms selected to provide a desired amount of uniaxial or biaxial tensile strain in channel regions of devices within the NMOS region. The top oxide layer is formed on the nitride layer and serves to facilitate patterning of the poly cap layer by permitting photoresist to more easily adhere to the poly cap layer. Typically, the top oxide layer is about 10 to 20 Angstroms thick.

An exemplary nitride layer formed at 222 comprises silicon and nitride of a suitable stoichiometry, such as $Si_3N_4$ or stoichiometric variations thereof (e.g., silicon nitride). In one aspect of the invention, the nitride comprises a relatively high initial (e.g., as-deposited) hydrogen content of about 20 atomic percent or more. In another aspect of the invention, the nitride layer provides a tensile stress of about 400–600 MPa in at least a portion of the NMOS region of the substrate prior to subsequent back-end thermal processing.

In one implementation, the nitride is deposited via a plasma enhanced chemical vapor deposition (PECVD) process using a relatively low deposition temperature of about 350 degrees C. or less to provide a meta-stable nitride film covering the NMOS and PMOS transistors with relatively high hydrogen content. In this example, the PECVD chamber pressure is controlled to about 3.5 Torr or more, with a silane ($SiH_4$) gas flow of about 150 sccm or less, and ammonia ($NH_3$) gas flow of about 2500–3000 sccm, using high frequency RF power set at about 50 W at 13.56 MHz and low frequency power set at about 10–20 W at 350 KHz. This exemplary PECVD process provides a meta-stable silicon nitride film (e.g., $Si_xN_y$, where X is approximately 3 and Y is approximately 4 in one example) with high hydrogen content, with the hydrogen being bonded about equally with silicon (e.g., Si—H bonds) and with nitrogen (e.g., N—H bonds). Moreover, this as-deposited meta-stable nitride film imparts a moderate initial tensile stress in the channel regions of the semiconductor device (e.g., about 400–600 MPa in this example). The above is merely one example of a suitable deposition process that may be employed to form the nitride layer(s) of the present invention, wherein any suitable processing conditions and techniques may be employed, and all such variant implementations are contemplated as falling within the scope of the present invention and the appended claims.

A poly cap anneal or thermal process is performed at 224 in order to apply uniaxial or biaxial strain to channel regions within the NMOS region of the semiconductor device. The time and temperature employed in performing the anneal are selected according to characteristics of the transistors being formed. As a result, the applied uniaxial or biaxial tensile strain resulting from performing the anneal with the poly cap layer improves performance of NMOS devices. The performance of PMOS devices is not substantially degraded because of the presence and use of the cap oxide layer containing nitride. Thus, channel mobility (electron mobility) is improved in the NMOS region and degradation of channel mobility is mitigated by the cap oxide layer. The cap oxide layer containing nitride in conjunction with hydrogen from the poly cal layer causes implanted p-type dopants within the PMOS region to diffuse at a rate that attains improved lateral abruptness for the dopant profile for source/drain regions within the PMOS region.

In an alternate aspect of the method 200, a portion of the poly cap layer is removed from the PMOS region prior to performing the poly cap anneal or thermal process. So doing can further mitigate performance degradation of PMOS devices.

An exemplary suitable poly cap anneal or suitable thermal process is a spike anneal performed for a relatively short time and high temperature in order to produce the tensile strain, described above. The time and temperature employed in the spike anneal are selected according to characteristics of the transistors being formed.

The poly cap layer is removed at 226 by, for example, employing a wet etch process. A suitable composition for the wet etch process is sulfuric acid. For the exemplary poly cap layer described above, a first etch selective to oxide is performed that removes the top oxide layer and the nitride layer. Subsequently, a second etch is performed that removes the lower oxide layer.

The method 200 then continues with silicide processing at 228, wherein a refractory metal material is formed over the device, followed by a thermal process, wherein the metal and silicon interfaces react to form silicide regions (on top of the gate and in the source/drain regions). Subsequently, un-reacted metal is stripped away leaving the formed silicide regions. Then, back end processing such as interlayer dielectric formation, contact/plug formation, and metallization are performed at 230 to conclude the device formation.

As stated previously, a poly cap layer can be employed to induce tensile strain in channel regions thereby improving channel mobility and, therefore, transistor performance in NMOS devices. Unfortunately, hydrogen content of the poly cap layer along with subsequent anneal result in increased diffusion of p-type dopants, such as boron, within PMOS devices. One mechanism to compensate for over diffused source/drain regions of PMOS devices is to implant an overdose amount during source/drain implanting in order to compensate for the loss due to diffusion. However, such PMOS devices do not perform as well as standard PMOS devices that are not subject to a poly cap layer containing hydrogen and a subsequent anneal.

Figure 3A:
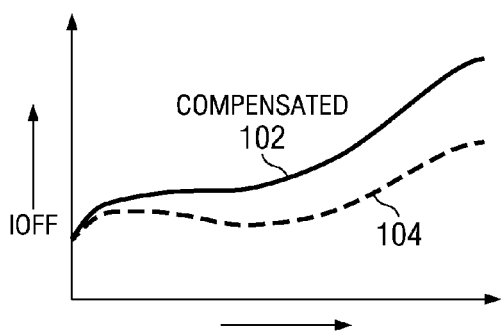
FIGS. 3A and 3B are simulated graphs illustrating PMOS transistor device performance for a standard PMOS device and a compensated overdosed PMOS device.
Figure 3B:
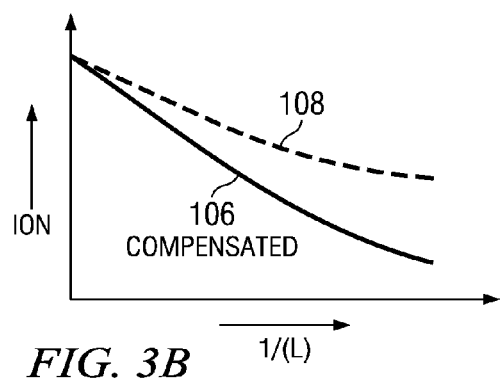

FIGS. 3A and 3B are simulated graphs illustrating PMOS transistor device performance for a standard PMOS device and a compensated, overdosed PMOS device. The standard PMOS device is fabricated with a selected dose for source/drain implants to attain a selected dopant concentration. The compensated, overdosed PMOS device is fabricated with an overdose amount for source/drain implants to attain a selected dopant concentration similar to that of the standard PMOS device. The overdosed PMOS device is subjected to a poly cap layer containing hydrogen and a strain inducing anneal, which results in diffusion of implanted dopants and requires that the source/drain regions be implanted by a larger dose than the standard PMOS device. However, FIGS. 3A and 3B illustrate that performance of the overdosed PMOS device is degraded when compared with the standard PMOS device, despite the overdose amount for the source/drain implants.

FIG. 3A is a graph comparing transistor current in an OFF state (IOFF) for a standard PMOS transistor and an overdosed PMOS transistor. The y-axis represents increasing values of transistor current in the OFF state and the x-axis represents the inverse of semiconductor (channel) length (1/L). Generally, a lower IOFF is desirable. Line 102 represents the compensated, overdosed PMOS transistor and line 104 represents the standard PMOS transistor. It can be seen that IOFF performance is lower for the compensated, overdosed PMOS transistor and that its relative performance worsens as the length L decreases.

FIG. 3B is a graph comparing transistor drive current in an ON state (ION) for a standard PMOS transistor and an overdosed PMOS transistor. The y-axis represents increasing values of transistor drive current in the ON state and the x-axis represents the inverse of semiconductor (channel) length (1/L). Generally, a greater ION is desirable. Line 106 represents the compensated, overdosed PMOS transistor and line 108 represents the standard PMOS transistor. It can be seen that ION performance is lower for the compensated, overdosed PMOS transistor and that its relative performance worsens as the length L decreases.

It is appreciated that FIGS. 3A and 3B are exemplary in nature and serve to illustrate differences in performance for the standard and overdosed PMOS transistors. The graphs of FIGS. 3A and 3B should not be interpreted to depict specific and/or actual values, but instead to illustrate the performance degradation in PMOS devices that remains even with overdosed PMOS devices.

Figure 4A:
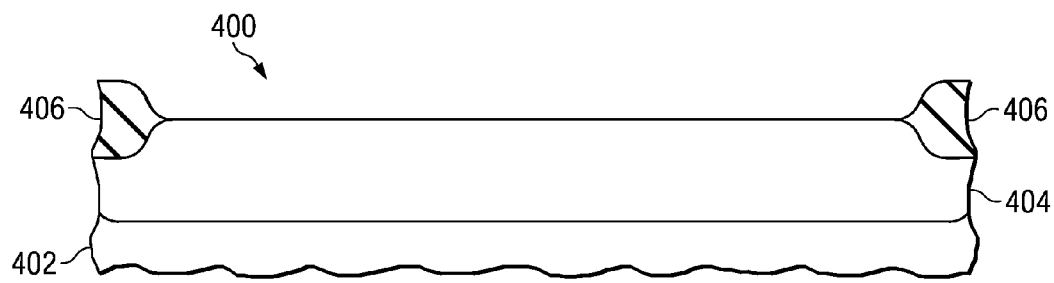
FIGS. 4A to 4O illustrate a plurality of fragmentary cross section diagrams illustrating a transistor device being formed of the method of FIG. 2 in accordance with an aspect of the present invention.
Figure 4B:
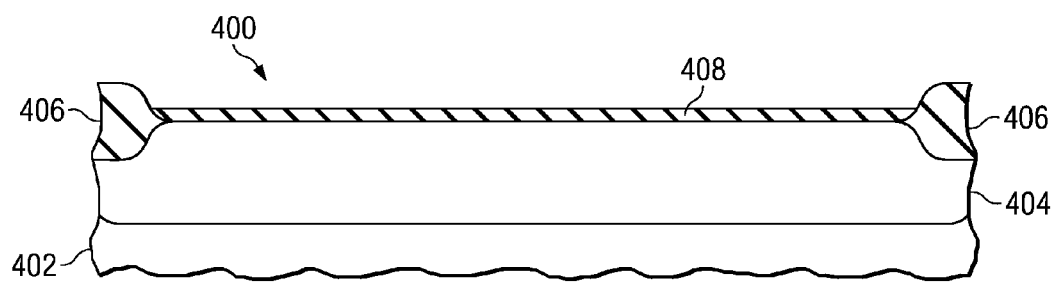
Figure 4C:
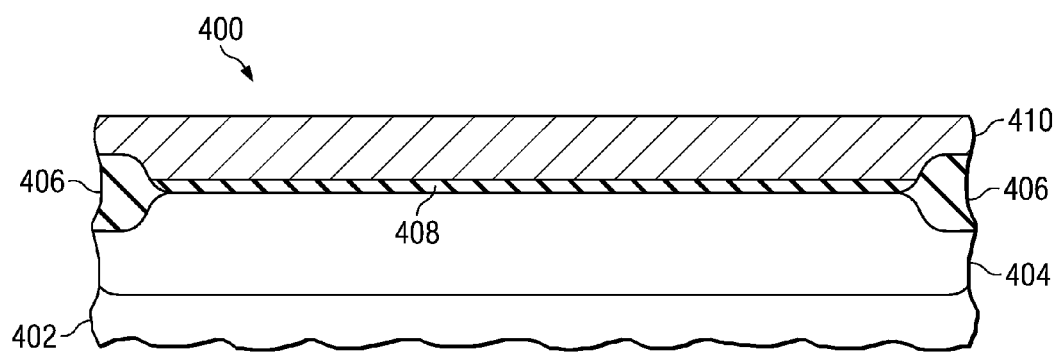
Figure 4D:
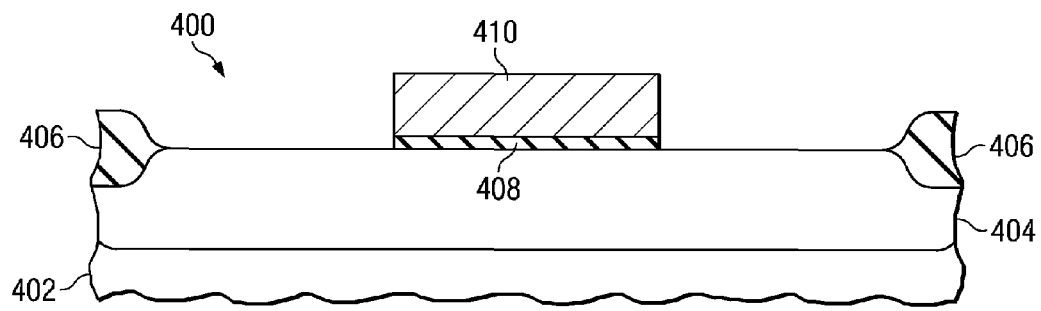
Figure 4E:
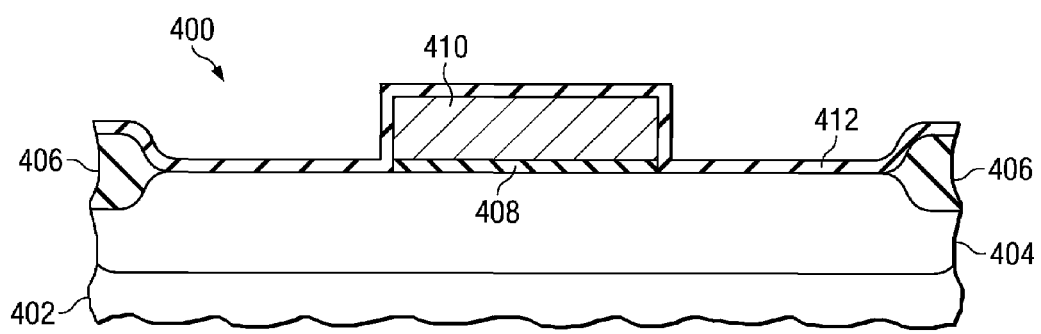
Figure 4F:
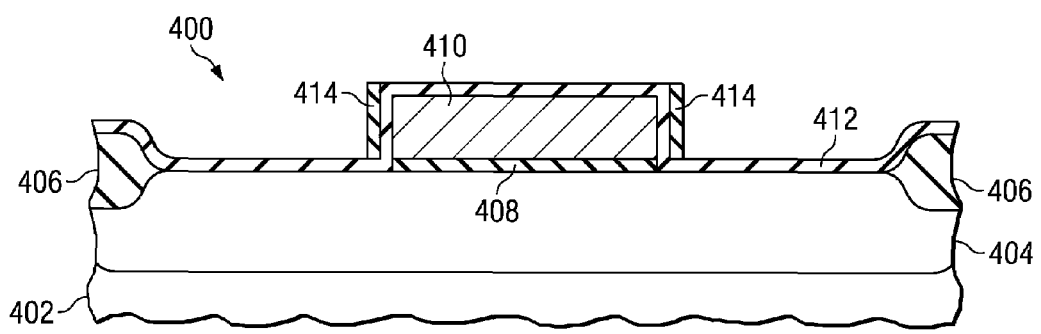
Figure 4G:
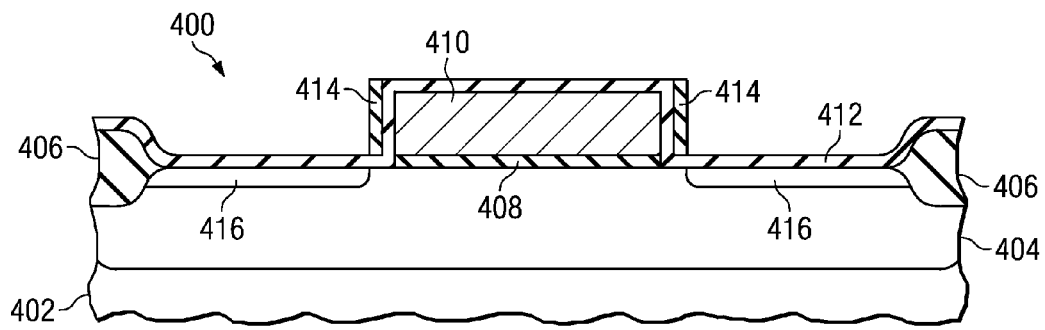
Figure 4H:
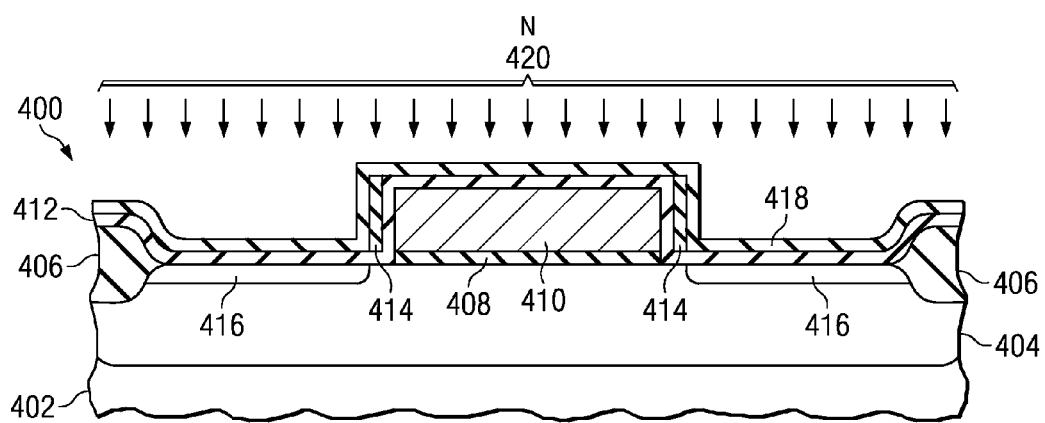
Figure 4I:
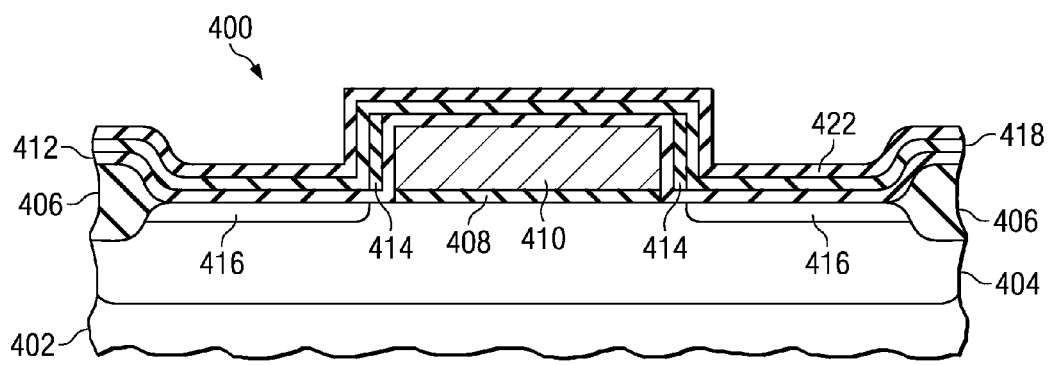
Figure 4J:
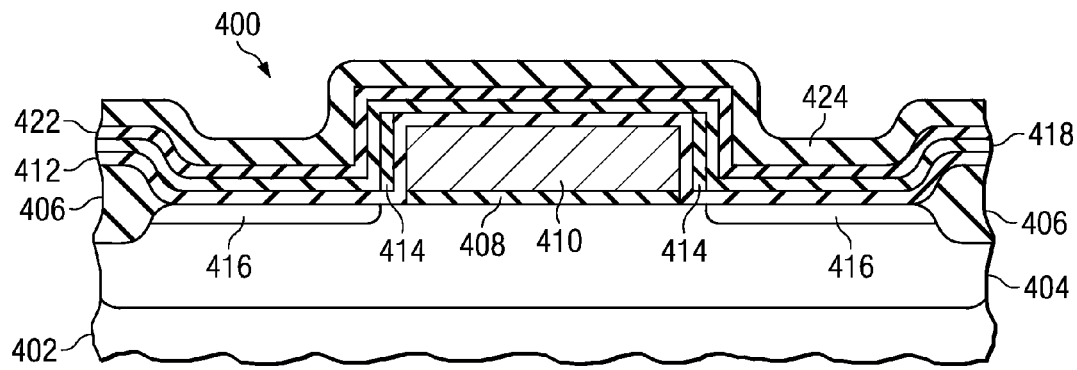
Figure 4K:
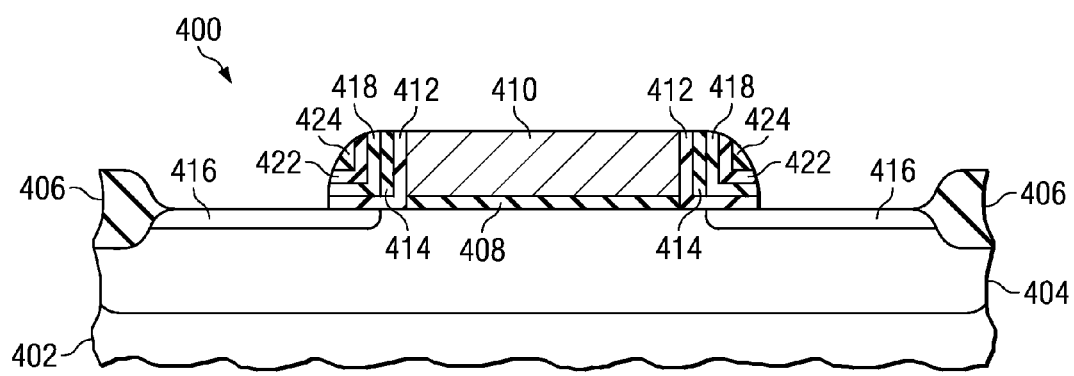
Figure 4L:
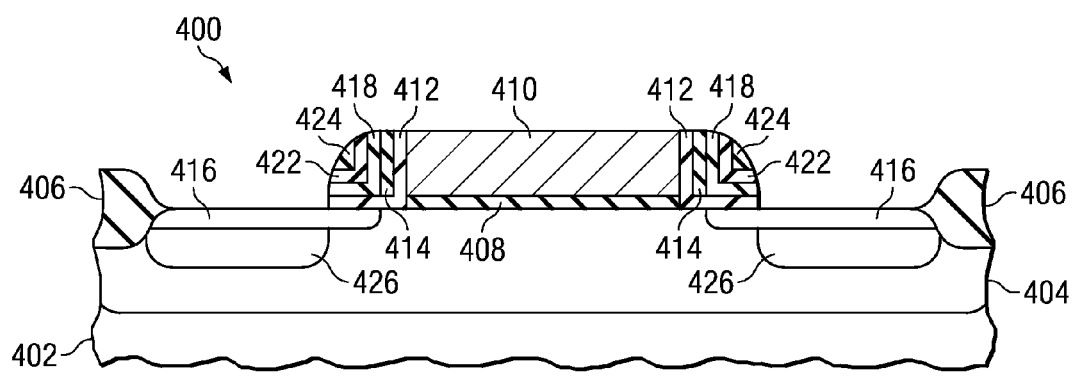
Figure 4M:
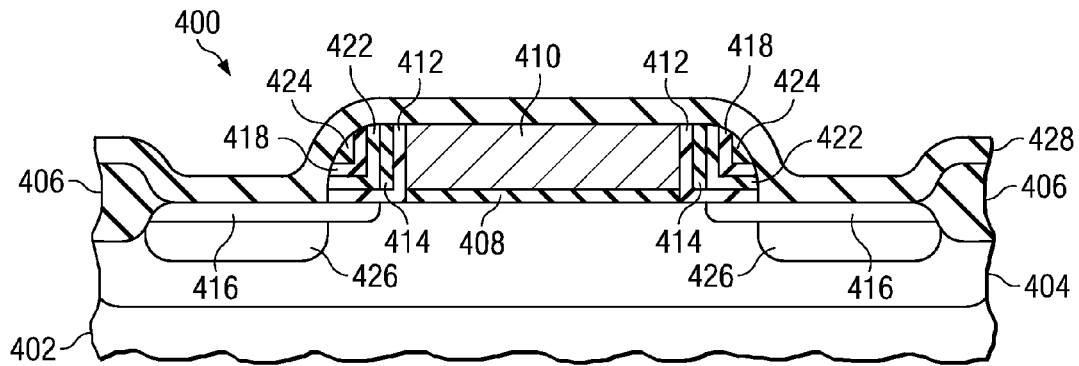
Figure 4N:
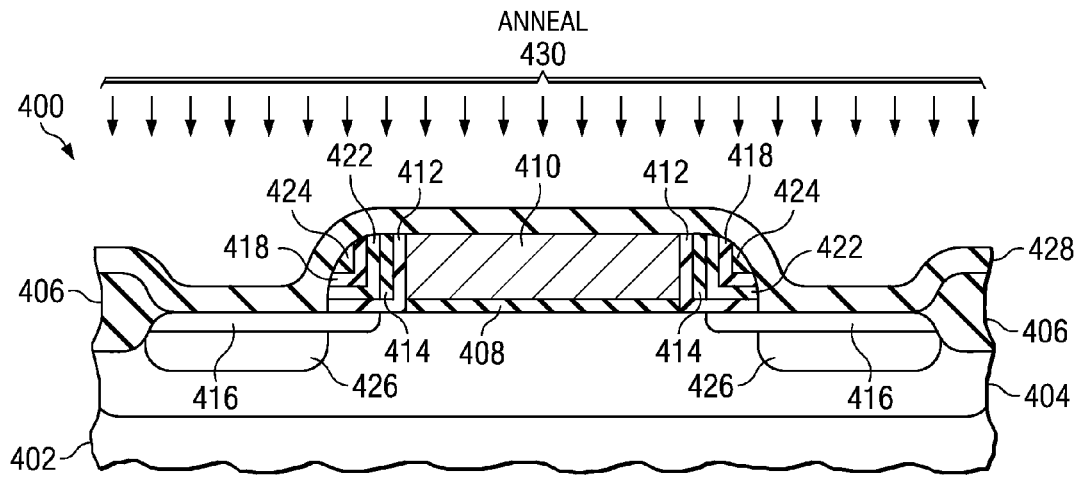
Figure 4O:
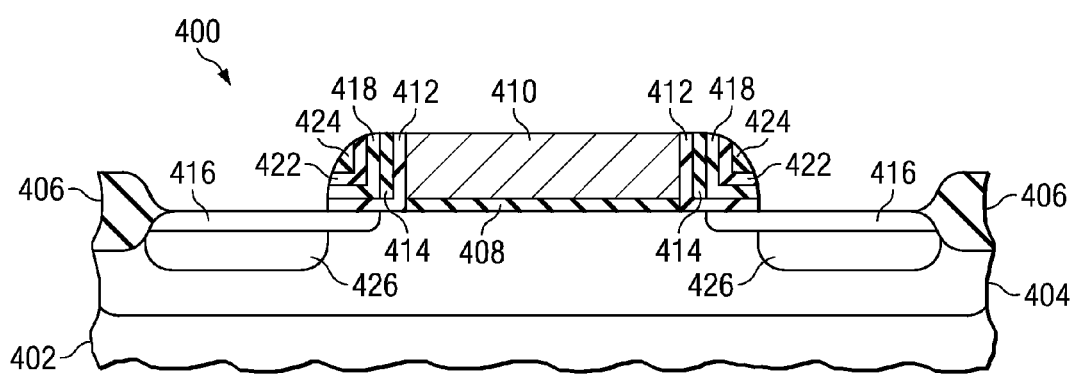

Turning now to FIGS. 4A–4O, a plurality of fragmentary cross section diagrams illustrating a transistor device being formed in accordance with the present invention of the method 200 of FIG. 2 is provided. The figures depict only a PMOS portion of the device in order to illustrate the present invention.

In FIG. 4A, a semiconductor device 400 is provided, wherein a semiconductor body 402, such as a semiconductor substrate, has a number of wells formed therein, including an n-well 404 to define a PMOS region and a p-well (not shown) to define an NMOS region, respectively. Further, isolation regions 406, such as STI regions or field oxide regions (LOCOS), are formed in the semiconductor body 402 to define active areas and electrically isolate individual devices. In FIG. 4B, the semiconductor device 400 is illustrated, wherein a gate oxide or dielectric layer 408 is formed, for example, by thermally grown silicon dioxide, over the active areas. Other types of dielectric materials can be employed instead of silicon dioxide.

Referring to FIG. 4C, a conductive gate electrode material (e.g., polysilicon) 410 has been deposited on the gate dielectric layer 408. For example, a polysilicon layer may be deposited via chemical vapor deposition (CVD). In FIG. 4D, the conductive gate electrode material 410 and the gate dielectric layer 408 are patterned to form a gate stack comprised of the gate electrode 410 and the gate dielectric layer 408.

FIG. 4E illustrates the semiconductor device after a poly oxide layer 412 has been grown over the device 400. The poly oxide layer 412 is relatively thin (e.g., about 8 Angstroms) and is grown by performing a thermal oxide growth process. Offset spacers 414 are then formed on lateral edges of the gate electrodes 410 by depositing an a thin offset layer, such as nitride or oxide, and anisotropically etching the device 400 thereby forming relatively thin offset spacers 414. FIG. 4F depicts the semiconductor device 400 after forming the offset spacers 414.

Extension regions are then formed by selectively implanting n-type dopants in the NMOS region and p-type dopants in the PMOS region. As a result, extension regions 416 are shown as formed in FIG. 4G. The extension regions 416 can be lightly doped, medium doped, or heavily doped and the gate stack serves to self align the extension regions. A thermal process can be employed to activate the implanted dopants.

Continuing, a nitride containing cap oxide layer 418 is formed over the device as shown in FIG. 4H. A suitable deposition process 420 incorporates nitride into deposition of oxide thereby forming the cap oxide layer 418 with a percentage of nitride (e.g., about 1 to 5 percent nitride by atoms). Other techniques of incorporating nitride into the cap oxide, such as nitridation, can be employed in accordance with the present invention.

FIG. 4I illustrates the semiconductor device 400 after formation of a nitride layer 422. Subsequently, a spacer oxide layer 424 is formed on the nitride layer 422 as shown in FIG. 4J. The spacer oxide layer 424 and the nitride layer 422 are then anisotropically etched to form relatively thick sidewall spacers as shown in FIG. 4K. It is appreciated that variations in composition and forming of the sidewall spacers is contemplated in accordance with the present invention. The sidewall spacers are formed so as to be substantially thicker than the offset spacers 414.

Source/drain regions 426 are formed in the PMOS region by selectively implanting a p-type dopant as shown formed in FIG. 4L. Source/drain regions are also formed in the NMOS region by selectively implanting an n-type dopant.

A poly cap layer 428 is formed over the semiconductor device 400, including both the NMOS and PMOS regions. FIG. 4M illustrates the poly cap layer 428 formed over the PMOS region. The poly cap layer 428 includes an amount of hydrogen (e.g., 20 percent by atoms), which affects subsequent diffusability of implanted p-type dopants within the PMOS region. Although not shown, a portion of the poly cap layer 428 can optionally be removed from the PMOS region thereby further mitigating degradation of PMOS performance.

A poly cap anneal, 430 is performed to induce tensile stress into channel regions of NMOS devices. FIG. 4N depicts the semiconductor device 400 undergoing the thermal process. The poly cap layer 428 containing hydrogen and the nitride containing cap oxide layer 418 cause p-type dopants to relatively quickly diffuse. As a result, a dopant profile for source/drain regions 426 of the PMOS region have a relatively abrupt lateral dopant profile, which facilitates performance of PMOS devices on the semiconductor device 400.

FIG. 4O depicts the semiconductor device 400 after removal of the poly cap layer 428. The poly cap layer 428 is removed by a suitable etch process, such as a wet etch process employing sulfuric acid.

Additional processing and fabrication of the semiconductor device 400 can also be performed including silicide region formation, contact formation, interlayer dielectric layers, metallization, and the like.

Figure 5:
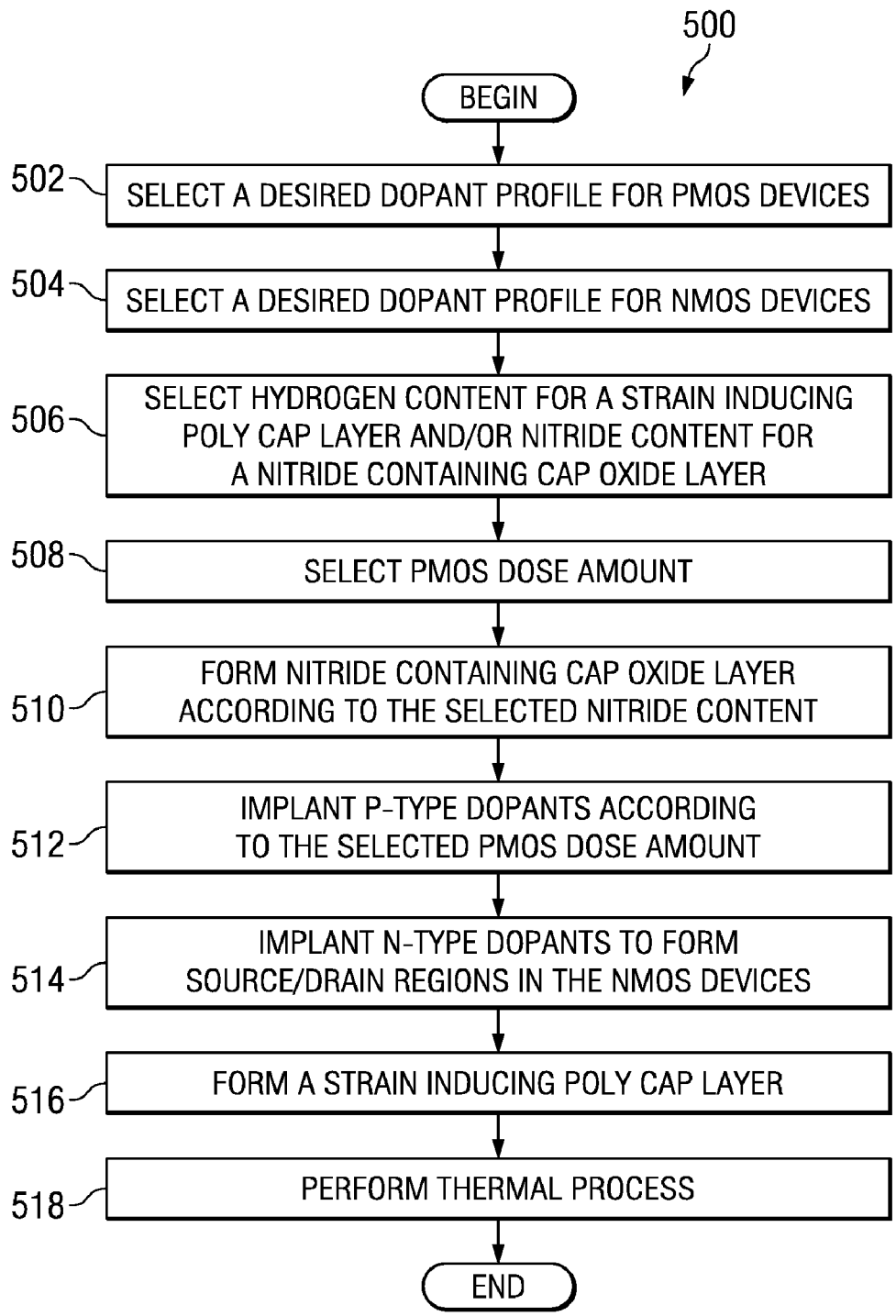
FIG. 5 is a flow diagram illustrating a method of fabricating a semiconductor device in accordance with an aspect of the present invention.

FIG. 5 is a flow diagram illustrating a method 500 of fabricating a semiconductor device in accordance with an aspect of the present invention. The method 500 selects desired characteristics and then selects processing parameters that attain the selected desired characteristics. The method 500 employs a hydrogen containing poly cap layer, which is employed to improve channel mobility in NMOS regions, and a nitride containing cap oxide layer, which is employed to mitigate degradation of channel mobility in PMOS regions.

The method 500 begins at 502, wherein a desired dopant profile for PMOS transistor devices located within a PMOS region of a semiconductor device is selected. The desired dopant profile includes concentration values per depth from surface as well as laterally through source/drain regions. A desired dopant profile for NMOS transistor devices located within an NMOS region of the semiconductor device is selected at 504.

Continuing, hydrogen content for a strain inducing poly cap layer and/or nitride content for a nitride containing cap oxide layer are selected at 506 according to the desired dopant profile for the PMOS transistor devices. As stated previously, diffusability of p-type dopants, such as boron, within PMOS regions is impacted by the nitride content of the cap oxide layer and the hydrogen content of the poly cap layer.

A PMOS dose amount for source/drain implants within source/drain regions of the PMOS region is selected at 508. The selected dose amount compensates for diffusion of implanted p-type dopants within the PMOS region and is selected according to the hydrogen content of the poly cap layer, the nitride content of the nitride containing cap oxide layer, and the desired dopant profile.

A nitride containing cap oxide layer, having the selected nitride content, is formed over active areas and gate stacks at 510. The active areas, the gate stacks, isolation regions, and the like are previously formed prior to forming the nitride containing cap oxide layer as discussed supra.

P-type dopants, such as boron, are implanted into active areas of the PMOS devices within the PMOS region according to the selected PMOS dose amount at 512, thereby forming source/drain regions of the PMOS devices. N-type dopants, such as phosphorous, are also implanted into active areas of the NMOS devices within the NMOS region according to the selected NMOS dose amount at 514, thereby forming source/drain regions of the NMOS devices.

A strain inducing poly cap layer is formed over both the NMOS and PMOS regions at 516. The strain inducing poly cap layer is formed having the selected hydrogen content. In an alternate aspects of the method 500, a portion of the strain inducing poly cap layer is removed from the PMOS region leaving the strain inducing poly cap layer substantially over only the NMOS region. Subsequently, the semiconductor device is subjected to a thermal process or anneal at 518 causing the implanted p-type dopants to diffuse into the cap oxide layer and attaining the desired dopant profile for PMOS devices and causing uniaxial or biaxial tensile strain to be induced across channel regions of NMOS devices within the NMOS region.

For purposes of simplicity of explanation, the methodologies of FIGS. 2, 4, and 5 are depicted and described as executing serially, it is to be understood and appreciated that the present invention is not limited by the illustrated order, as some aspects could, in accordance with the present invention, occur in different orders and/or concurrently with other aspects from that depicted and described herein. Moreover, not all illustrated features may be required to implement a methodology in accordance with an aspect the present invention.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method of fabricating a semiconductor device comprising:
   growing a poly oxide layer over gate electrodes formed on a semiconductor body and active regions defined within the semiconductor body in PMOS and NMOS regions;
   forming a nitride containing cap oxide layer over the grown poly oxide layer;
   forming offset spacers adjacent to sidewalls of the gate electrodes;
   forming extension regions within the PMOS region and the NMOS region;
   forming sidewall spacers adjacent to the sidewalls of the gate electrodes;
   implanting an n-type dopant into the NMOS region to form the active regions;

implanting a p-type dopant with an overdose amount into the PMOS region to form the active regions within the PMOS region;

forming a poly cap layer over the device, wherein the poly cap layer includes hydrogen; and performing an anneal that diffuses a portion of the implanted p-type dopant into the nitride containing cap oxide layer and obtaining a selected dopant profile having a selected lateral abruptness.

2. The method of claim 1, further comprising removing the poly cap layer subsequent to performing the anneal.

3. The method of claim 1, wherein performing the anneal further causes tensile strain to be introduced in channel regions of NMOS devices located within the NMOS region.

4. The method of claim 3, wherein forming the poly cap layer comprises forming one or more layers of selected composition and thickness that introduce a desired amount of the tensile strain on being subject to a thermal process.

5. The method of claim 1, wherein forming the poly cap layer comprises forming a lower oxide layer over the device and forming a nitride layer on the lower oxide layer.

6. The method of claim 1, wherein the anneal is performed at a temperature of about 900 to 1000 degrees Celsius.

7. The method of claim 1, wherein forming the sidewall spacers comprises forming a sidewall nitride layer comprised of nitride over the device, forming a layer of oxide on the sidewall nitride layer, and anisotropically etching the layer of oxide and the sidewall nitride layer to form the sidewall spacers comprising L-shaped nitride portions.

8. The method of claim 1, wherein forming the nitride containing cap oxide comprises forming oxide via a chemical vapor deposition process with a nitrogen containing gas.

9. The method of claim 8, wherein the nitrogen containing gas is ammonia.

10. The method of claim 1, wherein the nitride containing cap oxide layer is about 5 percent nitride.

11. The method of claim 1, wherein the poly cap layer comprises 20 percent hydrogen.

12. The method of claim 1, further comprising removing a portion of the poly cap layer from the PMOS region prior to performing the anneal.

13. A method of fabricating a semiconductor device comprising:

forming p-type and n-type well regions within a semiconductor body defining NMOS and PMOS regions, respectively;

forming isolation regions to define active areas and electrically isolate active areas from each other;

forming a gate oxide layer on the active areas defined by the isolation regions;

depositing a conductive gate layer and patterning to form gate electrodes;

growing a poly ox layer over the device;

forming offset spacers on lateral edges of the gate electrodes;

forming extension regions by implanting an n-type dopant into the active areas of the NMOS region and a p-type dopant into the active areas of the PMOS region;

forming a nitride containing cap oxide layer over the device;

forming sidewall spacers on the lateral edges of the gate electrodes;

forming source/drain regions within the NMOS region by selectively implanting an n-type dopant and forming source/drain regions within the PMOS region by selectively implanting a p-type dopant;

forming a strain inducing poly cap layer over the device, wherein the strain inducing poly cap layer includes a hydrogen composition; and performing a thermal process that causes tensile strain to be induced into channel regions of the NMOS region and causes dopants to diffuse according to the hydrogen composition of the strain inducing poly cap layer and the nitride composition of the nitride containing cap oxide layer.

14. The method of claim 13, further comprising performing a thermal process subsequent to forming extension regions to activate the dopants within the extension regions.

15. The method of claim 13, wherein performing the thermal process creates a dopant profile having a high lateral abruptness.

16. The method of claim 13, further comprising removing the poly cap layer and forming silicide regions on the gate electrodes and source/drain regions within the NMOS and PMOS regions.

17. A method of fabricating a semiconductor device comprising:

selecting a desired dopant profile for PMOS devices within a PMOS region, wherein the desired dopant profile includes a large lateral abruptness;

selecting a hydrogen content for a strain inducing poly cap layer;

selecting a nitride content for a nitride containing cap oxide layer;

selecting a PMOS dose amount that compensates for diffusion of implanted dopants as a function of the hydrogen content, the nitride content, and the desired dopant profile;

forming the nitride containing cap oxide layer over PMOS and NMOS regions of the semiconductor device according to the selected nitride content;

implanting p-type dopants into source/drain regions of the PMOS devices within the PMOS region according to the selected PMOS dose amount; and forming the strain inducing poly cap layer over the PMOS and NMOS regions according to the selected hydrogen content.

18. The method of claim 17, further comprising performing a thermal process after forming the strain inducing poly cap layer to induce a selected amount of strain in channel regions of NMOS devices within the NMOS region.

19. The method of claim 18, further comprising removing the strain inducing poly cap layer after performing the thermal process.

20. The method of claim 17, further comprising selecting a composition and thickness of the strain inducing poly cap layer.

21. The method of claim 17, further comprising implanting n-type dopants into source/drain regions of NMOS devices within the NMOS region according to a selected NMOS dose amount.

* * * * *